(12) United States Patent
Weber et al.

(10) Patent No.: US 9,825,165 B2
(45) Date of Patent: Nov. 21, 2017

(54) CHARGE-COMPENSATION DEVICE

(71) Applicant: Infineon Technologies Austria AG, Villach (AT)

(72) Inventors: Hans Weber, Bayerisch Gmain (DE); Markus Schmitt, Neubiberg (DE); Andreas Voerckel, Finkenstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/973,385

(22) Filed: Dec. 17, 2015

(65) Prior Publication Data
US 2016/0181416 A1 Jun. 23, 2016

(30) Foreign Application Priority Data
Dec. 22, 2014 (DE) .................. 10 2014 119 384

(51) Int. Cl.
| | | |
|---|---|---|
| *H01L 29/78* | (2006.01) | |
| *H01L 29/06* | (2006.01) | |
| *H01L 29/40* | (2006.01) | |
| *H01L 29/423* | (2006.01) | |
| *H01L 29/10* | (2006.01) | |

(52) U.S. Cl.
CPC ...... *H01L 29/7811* (2013.01); *H01L 29/0634* (2013.01); *H01L 29/402* (2013.01); *H01L 29/4238* (2013.01); *H01L 29/7813* (2013.01); *H01L 29/1095* (2013.01)

(58) Field of Classification Search
CPC ............. H01L 29/7811; H01L 29/7813; H01L 29/1095; H01L 29/402; H01L 29/4238; H01L 29/0634
See application file for complete search history.

(56) References Cited

U.S. PATENT DOCUMENTS

| | | | |
|---|---|---|---|
| 6,849,900 B2 | 2/2005 | Aida et al. | |
| 6,888,195 B2 * | 5/2005 | Saito .................. | H01L 29/0634 257/288 |
| 7,759,732 B2 * | 7/2010 | Saito .................. | H01L 29/0634 257/335 |

(Continued)

FOREIGN PATENT DOCUMENTS

| | | |
|---|---|---|
| DE | 102006047489 A1 | 4/2008 |
| DE | 102009038731 A1 | 7/2010 |

*Primary Examiner* — Galina Yushina
(74) *Attorney, Agent, or Firm* — Murphy, Bilak & Homiller, PLLC

(57) ABSTRACT

A charge-compensation semiconductor device includes a semiconductor body having a first surface, a lateral edge delimiting the semiconductor body in a horizontal direction substantially parallel to the first surface, an active area, a peripheral area arranged between the active area and the lateral edge, a drift region, first compensation regions forming respective first pn-junctions with the drift region, and second compensation regions extending from the first surface into the drift region and forming respective second pn-junctions with the drift region. The first compensation regions form in the active area a lattice comprising a first base vector having a first length. The second compensation regions have, in a horizontal direction parallel to the first surface, a horizontal width which decreases with an increasing vertical distance from the first surface and with a decreasing horizontal distance from the edge.

18 Claims, 10 Drawing Sheets

(56) References Cited

U.S. PATENT DOCUMENTS

| | | | |
|---|---|---|---|
| 2002/0123188 A1* | 9/2002 | Deboy | H01L 21/26513 438/212 |
| 2007/0272977 A1 | 11/2007 | Saito et al. | |
| 2008/0185643 A1 | 8/2008 | Hossain | |
| 2010/0264489 A1* | 10/2010 | Ohta | H01L 29/0634 257/334 |
| 2012/0112306 A1* | 5/2012 | Onishi | H01L 29/0634 257/487 |
| 2012/0248566 A1 | 10/2012 | Bobde et al. | |
| 2014/0077287 A1* | 3/2014 | Xu | H01L 29/66356 257/328 |
| 2014/0231903 A1* | 8/2014 | Willmeroth | H01L 29/0634 257/330 |

\* cited by examiner

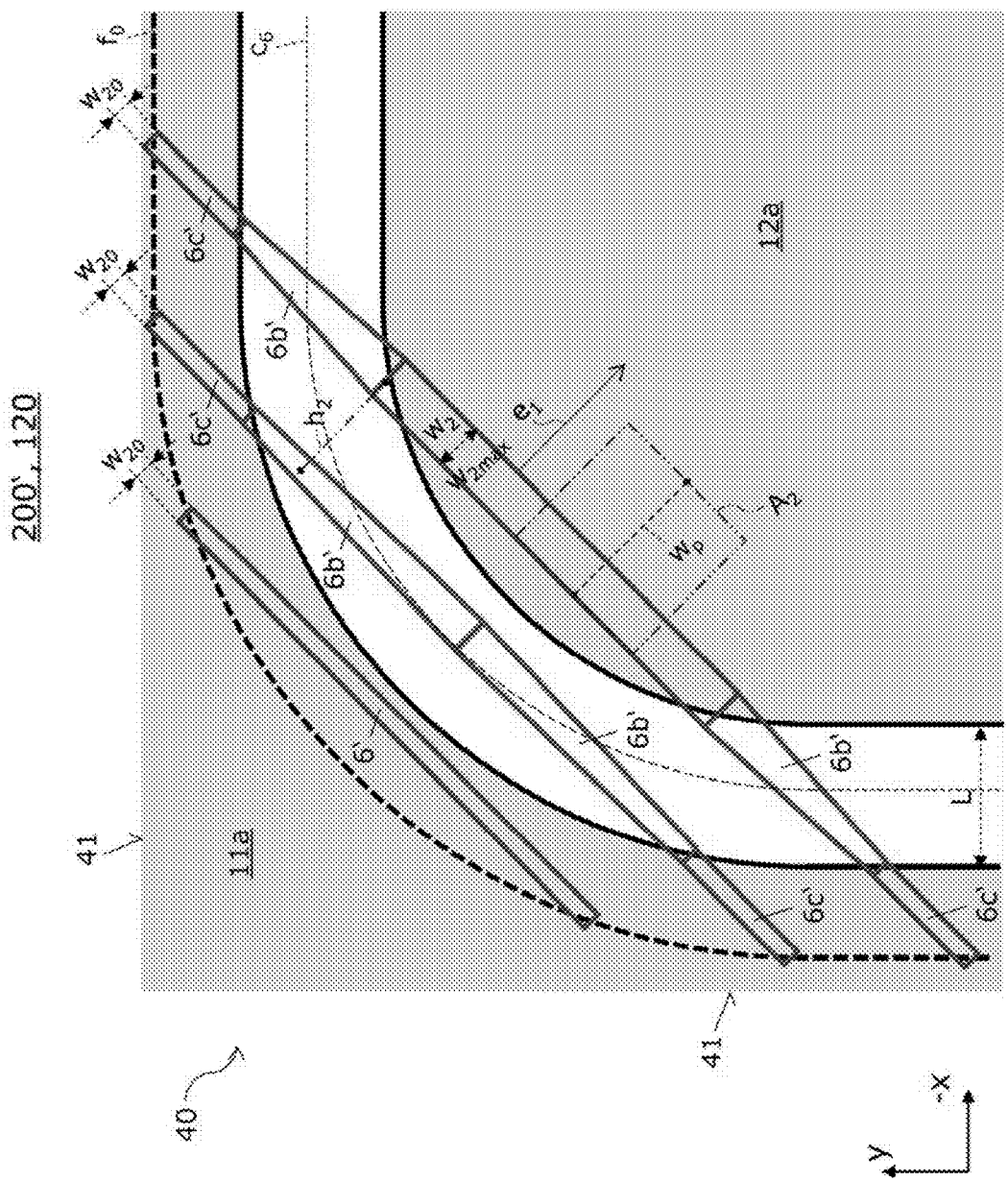

CHARGE-COMPENSATION DEVICE

PRIORITY CLAIM

This application claims priority to German Patent Application No. 10 2014 119 384.9 filed on 22 Dec. 2014, the content of the application incorporated herein by reference in its entirety.

TECHNICAL FIELD

Embodiments of the present invention relate to field-effect semiconductor devices having a charge-compensation structure, in particular to power semiconductor devices having in an active area a charge-compensation structure.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, low on-state resistance Ron, high breakdown voltages $U_{bd}$, high robustness and/or good softness are often desired.

To achieve low on-state resistance Ron and high breakdown voltages $U_{bd}$, charge-compensation semiconductor devices were developed. The compensation principle is based on a mutual compensation of charges in n- and p-doped regions, which are often also referred to as n- and p-doped pillar regions, in the drift zone of a vertical MOSFET.

Typically, the charge-compensation structure formed by p-type and n-type regions is arranged below the actual MOSFET-structure, with its source, body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a current-carrying area. The reduction of the on-state resistance Ron of such semiconductor power devices is associated with a reduction of the heat generated by the current in the on-state, so that such semiconductor power devices with charge-compensation structure remain "cool" compared with conventional semiconductor power devices.

As many other power semiconductor devices having an active area (cell area) surrounded by a peripheral area, charge-compensation devices are usually designed as vertically conducting devices. Accordingly, the electric current in the on state flows from the source on the front side to drain at the backside of the chip. The backside is often implemented as a "common-drain", i.e. as an equipotential surface at drain potential. Implementing also the front side as equipotential surface (at source potential) tends to be unfavorable with respect to leakage current and/or blocking behavior due to high electric fields at the lateral chip boundary surfaces (kerf, edge) during the blocking mode. Therefore, the lateral chip boundary at the front side is typically also kept at or close to drain potential during device operation. Next to the front side, a sufficiently smooth voltage drop from source potential in the active area to drain potential next to the lateral chip boundary is typically achieved by edge-termination structures at or next to the front side in the peripheral area. It is often desired that the blocking capability of the peripheral area including the edge is higher compared to the active area. However, the risk of a breakdown in the peripheral area may, for example due to manufacturing variations, be increased for charge-compensation devices also having charge-compensation structure in the peripheral area.

Accordingly, there is a need to improve semiconductor devices with charge-compensation structures and manufacturing of those semiconductor devices.

SUMMARY

According to an embodiment of a charge-compensation semiconductor device, the charge-compensation semiconductor device includes a semiconductor body including a first surface, a lateral edge delimiting the semiconductor body in a horizontal direction substantially parallel to the first surface, an active area, a peripheral area arranged between the active area and the lateral edge, a drift region, and compensation regions each of which forms a respective pn-junction with the drift region. The compensation regions form in the active area a lattice having a first base vector of a first length. In a vertical cross-section substantially perpendicular to the first surface, a horizontal width of the compensation regions decreases in the peripheral area with an increasing vertical distance from the first surface and with a decreasing horizontal distance from the edge. A source metallization is arranged on the first surface and in Ohmic contact with the compensation regions in the active area. A drain metallization is arranged opposite to the source metallization and in Ohmic contact with the drift region.

According to an embodiment of a charge-compensation semiconductor device, the charge-compensation semiconductor device includes a semiconductor body made of a semiconductor material and including a first surface, a lateral edge delimiting the semiconductor body in a horizontal direction substantially parallel to the first surface, an active area, a peripheral area arranged between the active area and the lateral edge, and a drift region doped with first dopants providing a first number of first charge carriers per unit in the semiconductor material. The charge-compensation semiconductor device further includes a source metallization arranged on the first surface, and a drain metallization arranged opposite to the source metallization and in Ohmic contact with the drift region. In a vertical cross-section perpendicular to the first surface, the semiconductor body further includes, compensation regions which alternate with portions of the drift region in the active area and in the peripheral area, have at least in the active area a first horizontal pitch, and are doped with second dopants providing a second number of second charge carriers per unit in the semiconductor material, the second charge carriers being different to the first charge carriers. The compensation regions of the active area are in Ohmic contact with the source metallization. A first doping-bias as a function of a horizontal distance from the active area changes its sign from one to minus one. The first doping-bias is defined as an integral obtainable by integrating a first function along a horizontal line arranged in the peripheral area at the horizontal distance from the active area and having a length equal to the first horizontal pitch or an integer multiple thereof. The first function is defined as a difference between a concentration of the second dopants multiplied by the second number and a concentration of the first dopants multiplied by the first number.

According to an embodiment of a charge-compensation semiconductor device, the charge-compensation semiconductor device includes a semiconductor body including a first surface, a lateral edge delimiting the semiconductor body in a horizontal direction substantially parallel to the first surface, an active area, a peripheral area arranged between the active area and the lateral edge, and a drift region of a semiconductor material doped with first dopants providing a first number of first charge carriers per unit in the semiconductor material. A source metallization is arranged on the first surface, and a drain metallization is arranged opposite to the source metallization and in Ohmic contact with the drift region. In horizontal cross-sections parallel to the first surface, the semiconductor body further includes compensation regions of the semiconductor material each of which forms a pn-junction with the drift region and is doped with second dopants providing a second number of second charge carriers per unit in the semiconductor material. The compensation regions in the active area are in Ohmic contact with the source metallization and form in each of the horizontal cross-sections a lattice with a unit cell including a common first base vector having a first length. A first doping-bias as a function of a horizontal distance from the active area changes its sign from one to minus one. The first doping-bias is defined as a surface integral obtainable by integrating a first function over an area of a cell which is arranged in the peripheral area at a distance from the first surface of less than about two times the first length and has the same shape as the unit cell. The first function is defined as a difference between a concentration of the second dopants multiplied by the second number and a concentration of the first dopants multiplied by the first number.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 7 illustrates a layout of a semiconductor device, according to an embodiment.

DETAILED DESCRIPTION

Figure 1:
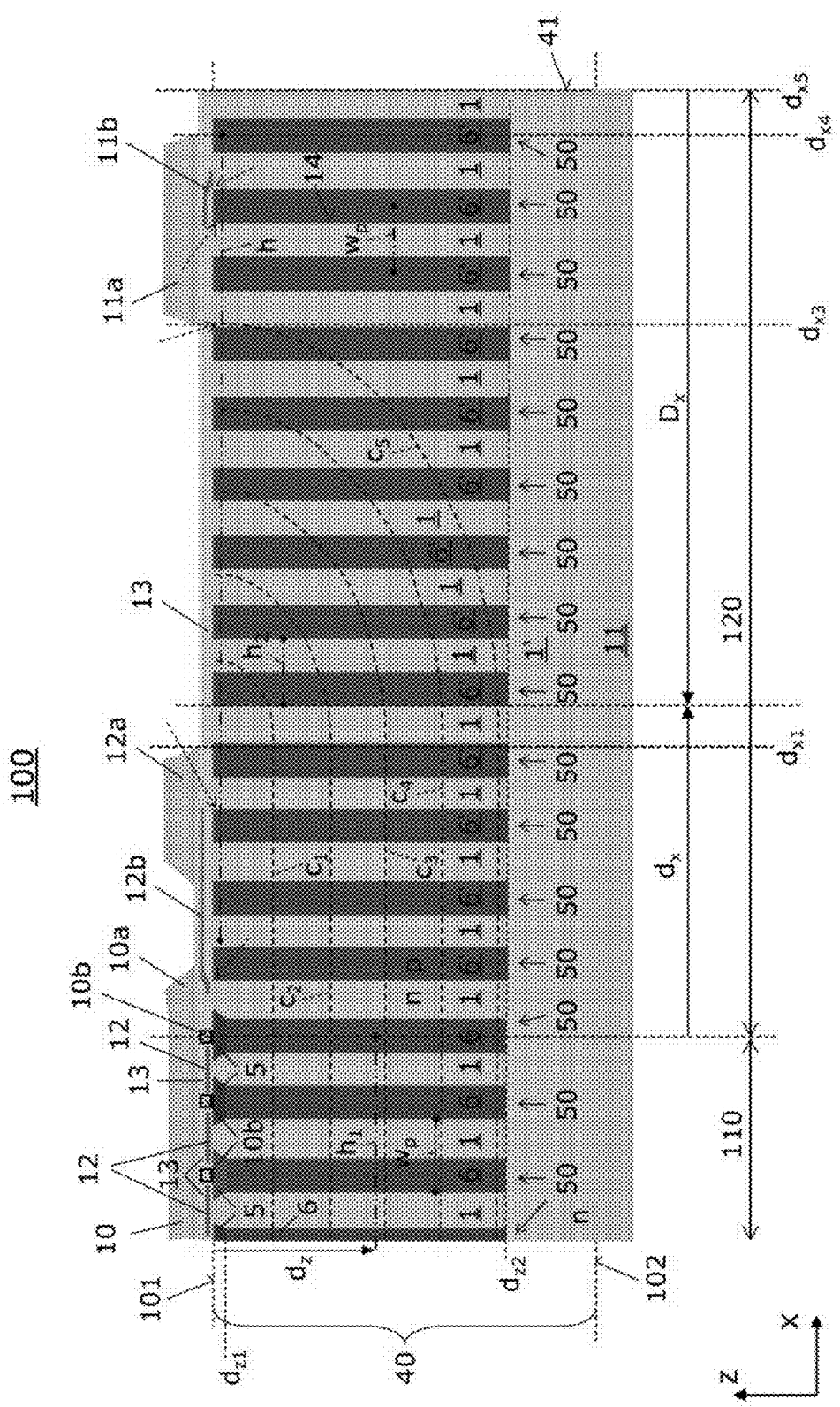
FIG. 1 illustrates a vertical cross-section through a semiconductor body of a semiconductor device, according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n⁻" means a doping concentration which is less than the doping concentration of an "n"-doping region while an "n⁺"-doping region has a larger doping concentration than the "n"-doping region. However, indicating the relative doping concentration does not mean that doping regions of the same relative doping concentration have to have the same absolute doping concentration unless otherwise stated. For example, two different n⁺-doping regions can have different absolute doping concentrations. The same applies, for example, to an n⁺-doping and a p⁺-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a source metallization and an insulated gate electrode arranged on the first surface and a drain metallization arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or about 500 V. Within this specification the terms "power semiconductor device" and "power semiconductor component" are used synonymously.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g., at the edge and/or backside of the semiconductor device. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are in low Ohmic contact with a drain electrode (drain metallization). The source region is in low Ohmic contact with a source electrode (source metallization). In the context of the present specification, the term "in Ohmic contact" intends to describe that there is a low-ohmic ohmic current path between respective elements or portions of a semiconductor device when no voltages or only small probe voltages are applied to and/or across the semiconductor device. Within this specification the terms "in Ohmic contact", "in resistive electric contact", "electrically coupled", and "in resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e. g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone whereby the current flow between two electrodes or metallizations connected to the semiconductor body can be prevented.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from a conducting direction in which a pn-load junction, for example the pn-junction between the body region and the drift region of a MOSFET, is forwardly biased to the opposite direction or blocking direction in which the pn-load junction is reversely biased. The term "hard commutating" as used in this specification intends to describe commutating with a speed of at least about $10^9$ V/s, more typically with a speed of at least about $5*10^9$ V/s.

The term "pn-junction" as used in this specification intends to describe the boundary surface between adjoining semiconductor regions or semiconductor portions of different conductivity type.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (ALGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (ALGaInN), indium gallium nitride (InGaN)-aluminum gallium indium nitride (ALGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of a charge-compensation semiconductor device 100 is explained. FIG. 1 illustrates a vertical cross-section through a semiconductor body 40 of the semiconductor device 100. The semiconductor body 40 extends between a first surface 101, facing a vertical direction z, and a second surface (back surface) 102 arranged opposite to the first surface 101. In a horizontal direction x that is substantially parallel to the first surface 101, the semiconductor body 40 is delimited by an edge or kerf 41, for example a sawing edge, which is substantially orthogonal to the first surface 101. In the following the edge 41 is also referred to as lateral edge 41. The semiconductor body 40 has an active area 110 and a peripheral area 120 arranged between the active area 110 and the edge 41. Typically, the peripheral area 120 surrounds the active area 110 when seen from above.

The semiconductor body 40 includes a mono-crystalline drift region 1, 1' of a semiconductor material, such as silicon, doped with first dopants (dopants of a first conductivity type) providing a first number of first free charge carriers per unit in the semiconductor material. In the exemplary embodiment, drift region 1, 1' is n-type, i.e., doped with n-type dopants. For example, the semiconductor material may be silicon and the n-type dopants may be electrically active phosphorous or arsenic impurities providing one free electron per unit.

The semiconductor body 40 typically includes a bulk mono-crystalline substrate (not shown in FIG. 1) of the semiconductor material and at least one layer 1', 1, typically at least one epitaxial layer 1', 1 of the same semiconductor material formed thereon and extending to the first surface 101. Using the epitaxial layer(s) 1' provides more freedom in tailoring the background doping of the material since the doping concentration can be adjusted during deposition of the epitaxial layer or layers.

A source metallization 10 is arranged on the first surface 101. A drain metallization 11 in Ohmic contact with the drift region 1, 1' is arranged on the second surface 102, i.e., opposite to the source metallization 10.

Furthermore, a plurality of gate electrodes 12 is typically also arranged on the first surface 101 in the active area 110 and insulated from the source metallization 10 and the semiconductor body 40 by a dielectric region 13. The gate electrodes 12 are connected to a gate metallization and gate pad, respectively, that is not shown in FIG. 1. Accordingly, the semiconductor device 100 may be operated as a three-terminal device (MOSFET).

In the illustrated vertical cross-section of FIG. 1, compensation regions 6, 6' alternate with portions 1 of the drift region 1, 1' both in the active area 110 and in the peripheral area 120. The compensation regions 6, 6' are typically made of the same semiconductor material as the drift region 1, 1' but are doped with second dopants (dopants of a second conductivity type opposite to the first conductivity type) providing a second number of free second charge carriers per unit in the semiconductor material. In the exemplary embodiment, compensation regions 6, 6' are p-type, i.e., doped with p-type dopants. For example, the semiconductor material may be silicon and the p-type dopants may be electrically active boron impurities providing one free hole per unit in silicon.

A doping concentration of the drift portions 1 may be higher than a doping concentration of an adjoining common drift layer of the drift region 1, 1' arranged below the drift portions 1.

Typically, a plurality, e.g., more than ten, of alternating n-type drift portions 1' and p-type compensation regions 6, 6' forming respective pn-junctions 14 with each other are arranged in the active area 110 and in the adjoining peripheral area 120.

In the exemplary embodiment, the p-type compensation regions 6 are, in the vertical cross-section, formed as vertically orientated pillars. Alternatively, the p-type compensation regions 6 are formed as substantially vertically orientated strip-type parallelepipeds, rectangles or ellipsoids.

In the following, the n-type drift portions 1 are also referred to as n-type pillar regions 1 and first pillar regions 1 (of the first conductivity type), respectively, and the p-type compensation regions 6, 6' are also referred to as p-type pillar regions 6, 6' and second pillar regions 6, 6' (of the second conductivity type), respectively.

The p-type compensation regions 6 may be formed in trenches 50 extending from the first surface 101 into the semiconductor body 40 by selective epitaxial deposition.

In the exemplary embodiment, the compensation regions 6, 6' have in the active area 110 and the peripheral area 120 the same horizontal pitch $w_p$.

The term "pitch" as used within this specification intends to describe a distance between repeated elements in a structure possessing translational symmetry and typically corresponds to length of a primitive axis (vector) of the structure and length of a base vector of a regular lattice, respectively.

Furthermore, the compensation regions 6 in the active area 110 and the compensation regions 6' in the peripheral area 120 may extend to the same vertical depth $d_{z2}$ into the drift region 1, 1'. In the following, the vertical direction corresponds to the z-direction of a Cartesian co-ordinate system while horizontal directions lie in the x-y plane.

The compensation regions 6 of the active area 110 are in Ohmic contact with the source metallization 10, typically via higher p-doped body regions 5 arranged between the compensation regions 6 and the first surface 101. The compensation regions 6 of the active area 110 are in the following also referred to as first compensation regions 6.

The first compensation regions 6 are typically spaced apart from the first surface 101 and arranged at a vertical distance $d_{z1}$ from the first surface 101, respectively.

Different thereto, the compensation regions 6' of the peripheral area 120 are typically floating, i.e., not in Ohmic contact with an external metallization, and the first compensation regions 6, respectively. In the following the compensation regions 6' of the peripheral area 120 are also referred to as second compensation regions 6' and floating compensation regions 6', respectively. The second compensation regions 6' may extend to the first surface 101.

The second compensation regions 6' may extend at least close to the lateral edge 41. A distance between an outermost of the second compensation regions 6' and the lateral edge 41 may be in a range from about 1% to about 5% of a distance between the active area 110 and the lateral edge 41 (in the same horizontal direction). For example, the distance between an outermost of the second compensation regions 6' and the lateral edge 41 may be smaller than the horizontal pitch $w_p$ of the second compensation regions 6' and the first compensation regions 6', respectively.

Typically, two n⁺-type source regions (not shown in FIG. 1) are formed in each of the p-type body regions 5 (except for the body region 5 at the border between the active area 110 and the peripheral area 120, which may only have one embedded source region in the active area 110).

A lower portion of the dielectric region 13 is, in the active area 110, arranged between the first surface 101 and each of the gate electrodes 12, and extends in a horizontal direction from the drift portion 1 along the body region 5 at least to the source region so that an inversion channel, which is also referred to herein as MOS-channel, may be formed by the field-effect in a channel region of the body region 5 along the lower portion(s) of the dielectric region 13 forming a gate dielectric region. Accordingly, the semiconductor device 100 may be operated as an n-channel MOSFET. In embodiments referring to p-channel MOSFET, the doping relations are reversed.

The remaining portion of the dielectric region 13 forms an interlayer dielectric between the source metallization 10 and the gate electrode 12 and between the source metallization 10 and the first surface 101, respectively.

In the exemplary embodiment, the source metallization 10 is electrically contacted with the source regions and the body contact region via source contacts 10b that may be implemented as shallow trench contacts 10b formed through the interlayer dielectric 13 and into the semiconductor body 40. In other embodiments, the source metallization 10 electrically contacts the source region and the body contact region substantially at the first surface 101.

According to another embodiment, the gate electrode(s) 12 and gate dielectric(s) 13 are formed in respective trenches extending from the first surface 101 into the semiconductor body 40. Accordingly, the gate electrodes are implemented as trench gate electrodes arranged in vertical trenches with insulated walls. In this embodiment, the body region 5 and source regions adjoin an upper part of the respective trench while the drift portions 1 adjoin a lower part of the respective trench. In this embodiment, the drift portions 1 may not extend to the first surface 101 in the active area 110.

The active area 110 may be defined by the presence of source regions and insulated gate electrodes 12 configured to form and/or change a channel region in an adjacent the body region 5. The active area 110 may also be defined by the presence of active cells, typically MOSFET-cells, for carrying a load current between the source metallization 10 and the drain metallization 11.

As illustrated in FIG. 1, the interlayer dielectric 13 typically also covers the semiconductor body 40 in the peripheral area 120. The interlayer dielectric 13 may substantially extend to the edge 41.

According to an embodiment, the doping concentrations of the p-type first compensation regions 6 and the drift portions 1 are chosen such that, in the off-state, their charges can be mutually depleted and that, in the on-state, an uninterrupted, low-resistive conduction path is formed from the source metallization 10 to the drain metallization 11.

A total number of free electrons provided by n-type dopants substantially matches a total number of free hole provided by p-type dopants in the active area 110 between vertical distance dz1 and the vertical depth dz2. Typically, the total number of free electrons provided by the n-type dopants varies by less than 5%, more typically less than 1% from the total number of free hole provided by the p-type dopants in the active area 110 between the vertical distance $d_{z1}$ and the vertical depth $d_{z2}$. Accordingly, the drift portions 1 and the first compensation regions 6 form a pn-compensation structure 1, 6.

In embodiments in which the p-type dopants and the n-type dopants provide the same number of free charge carriers per dopant, for example one free charge carriers per dopant as boron and phosphorous or arsenic in silicon and germanium, an integral obtained by (mathematically) integrating a concentration of n-dopants in the drift portions 1 between the vertical distance $d_{z1}$ and the vertical depth $d_{z2}$ typically substantially matches (differs by at most 5% from) an integral obtained by (mathematically) integrating a concentration of p-dopants in the first compensation regions 6 between the vertical distance $d_{z1}$ and the vertical depth $d_{z2}$.

Compensation may also be expressed in terms of a first function defined as a difference between a concentration of the second dopants multiplied by the second number and a concentration of the first dopants multiplied by the first number. The first function may alternatively also be expressed as a difference between a concentration of free holes and a concentration of free electrons in the semiconductor material of the semiconductor body (e.g. at room temperature).

For sufficient compensation, the magnitude (absolute value) of an integral obtained by integrating the first function in the active area 110 between the vertical distance $d_{z1}$ and the vertical depth $d_{z2}$ should be small, typically less than 5% or even less than 1%, compared to a number of free holes of the active area 110 and a number of free electrons of the active area 110 between the vertical distance $d_{z1}$ and the vertical depth $d_{z2}$. The number of free holes of the active area 110 may be obtained by integrating the concentration of the second dopants multiplied by the second number in the active area 110 between the vertical distance $d_{z1}$ and the vertical depth $d_{z2}$ The number of free electrons of the active area 110 may be obtained by integrating the concentration of the first dopants multiplied by the first number in the active area 110 between the vertical distance $d_{z1}$ and the vertical depth $d_{z2}$.

In embodiments in which the p-type dopants and the n-type dopants provide the same number of free charge carriers per dopant, the first function may also be expressed as a difference between a concentration of p-type dopants in the semiconductor body and a concentration of n-type dopants in the semiconductor body.

According to an embodiment, a doping-bias of the peripheral area $L_h$ defined as an integral obtainable by integrating the first function along a horizontal line $h_2$, which is arranged in the peripheral area 120 at a horizontal distance $d_x$ from the active area 110, crosses at least one pn-junction 14 and has a length equal to the first horizontal pitch $w_p$ or an integer multiple thereof, changes at the first surface 101 and next to the first surface 101 as function of the horizontal distance $d_x$ its sign from one to minus one (typically once). In the following, the doping-bias of the peripheral area $L_h$ is also referred to as first doping-bias $L_h$ and horizontal doping-bias $L_h$, respectively. In accordance with its definition, the sign of the doping-bias $L_h$ is one if the number of active p-dopants outweighs the number of active n-dopants at the horizontal line $h_2$, and minus one if the number of active n-dopants outweighs the number of active p-dopants at the horizontal line $h_2$.

Along a line h which is close to the first surface 101, i.e., at a distance from the first surface 101 of less than about two times the first horizontal pitch $w_p$, which is also referred to as first length $w_p$ of a base vector of a corresponding lattice, the first doping-bias $L_h$ typically changes from positive values corresponding, for n-channel devices, to an excess of free holes next to the active area 110 (p-doped body regions 5) to negative values corresponding, for n-channel devices, to an excess of free electrons closer and next to the edge 41.

According to numerical simulations (not shown) of semiconductor device 100, a transition from positive values of the first doping-bias $L_h$ (excess of free holes for n-channel devices) next to the active area 110 to negative values next to the edge 41 in the peripheral area 120 and next to first surface 101 results in reducing the risk of an unwanted breakdown during the blocking mode in the peripheral area 120.

In FIG. 1, dashed arrows point to regions of higher breakdown risk that can be reduced by an appropriate first doping-bias $L_h$ next to the first surface 101 having positive values next to the active area 110 and negative values next to the edge 41. Other methods such as VLD edge-structures (variation of lateral doping) for reducing breakdown risk next to edges of field plates, typically result in higher manufacturing complexity and/or costs compared to using second compensation regions 6' with dopings resulting in the desired first doping-bias $L_h$. This is because the first and second compensation regions 6, 6' can be manufactured in common processes, while e.g. VLD edge-structure require additional masks and implantations.

In the exemplary embodiment, a drain field plate 11a in Ohmic contact with the drain metallization 11 is arranged on the first surface 101 and next to the edge 41 in the peripheral area 120 as equipotential region (edge termination). Further, a poly-silicon layer 11b in Ohmic contact with the drain field plate 11a and embedded in the dielectric region 13 may be arranged next to the edge 41 and between the drain field plate 11a and the first surface 101. The drain field plate 11a typically surrounds the active area 110 when seen from above and is therefore also referred to as drain ring 11a and conductive drain ring 11a, respectively.

Further, a gate field plate 12a is arranged on the first surface 101 in the peripheral area 120 and contacted with the non-shown gate metallization via a further poly-silicon layer 12b embedded in the dielectric region 13. The gate field plate 12a typically surrounds the active area 110 when seen from above and is therefore also referred to as gate ring 12a and conductive drain ring 12a, respectively. The gate field plate 12a is typically arranged between the drain field plate 11a and the source metallization 10.

Further, an outermost portion 10a of the source metallization 10 may be formed as source field plate, typically as a stepped source field plate.

The drain field plate 11a and/or the gate field plate 12a may be also be stepped, i.e., the vertical (minimum) distance of the field plates 11a and/or 12a from the first surface 101 may change substantially stepwise in horizontal direction x. In other embodiments, only one or even none of the field plate 11a, 12a is arranged on the first surface 101.

Figure 2:
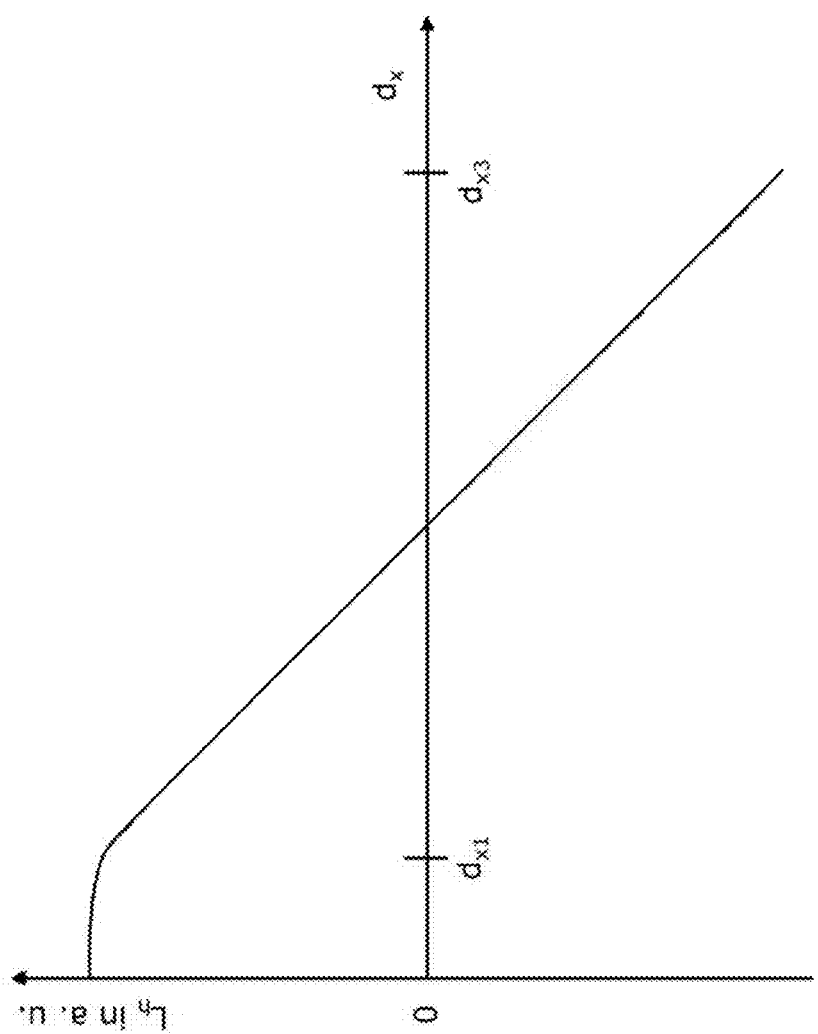
FIG. 2 illustrates a first doping-bias as function of a horizontal distance from the active area of a semiconductor body, according to an embodiment.

In embodiments referring to charge-compensation semiconductor device having a drain field plate 11a and a gate field plate 12a as the semiconductor device 100 illustrated in FIG. 1, a linear or at least substantially linear profile of the first doping-bias $L_h$ in the semiconductor body 40 next to the first surface 101 and in horizontal direction (x) between the gate field plate 12a and the drain field plate 11a has been found to be particularly useful with regard to the breakdown behavior of the charge-compensation semiconductor device. Such a profile is illustrated in FIG. 2.

Typically, the first doping-bias $L_h$ is, in the vertical cross-section, substantially linear between a maximum horizontal co-ordinate $d_{x1}$ (outermost horizontal position) of the conductive gate ring 12a and a minimum horizontal co-ordinate $d_{x3}$ (innermost horizontal position) of the conductive drain ring 11b. The first doping-bias $L_h$ may, in the vertical cross-section, even be substantially linear between the maximum horizontal co-ordinate $d_{x1}$ of the conductive gate ring 12a and a minimum horizontal co-ordinate $d_{x4}$ of the conductive drain ring 11b.

This may also be expressed in terms of a distance $D_x = d_5 - d_{x1}$ to the edge 41 arranged at horizontal co-ordinate $d_{x5}$ in FIG. 1. Accordingly, the first doping-bias $L_h$ is, in the vertical cross-section, substantially linear between a minimum horizontal distance $(D_{x1} = d_{x5} - d_{x1})$ of the conductive gate ring 12a from the edge 41 and a maximum horizontal distance $(D_{x3} = d_{x5} - d_{x3})$ of the conductive drain ring (11a), for example between minimum horizontal distance $(D_{x1} = d_{x5} - d_{x1})$ and a minimum horizontal distance $(D_{x4} = d_{x5} - d_{x4})$ from the (closest) edge 41.

The term "substantially linear" as used in this specification intends to describe a deviation from a linear relationship of at mots about 10%, typically of less than about 5% or even less than about 1%.

The doping-bias $L_h$ in the peripheral area 120 may be a monotonic (or at least a substantially monotonic) function of the horizontal co-ordinate $d_x$. In other embodiments, the doping-bias $L_h$ in the peripheral area 120 may have a peak or maximum between the boundary to the active area 110 ($d_x=0$) and the maximum horizontal co-ordinate $d_{x1}$ of the gate ring 12a.

As indicated by the dashed curves $c_1$ to $c_5$ in FIG. 1 which correspond to typical curves of equal doping-bias (isodoping-bias curves), the doping-bias $L_h$ is typically correlated with a doping bias $L_v$ of the active area 110.

The doping bias $L_h$ of the active area 110 may, as function of the vertical distance $d_z$ from the first surface 101, be defined as an integral obtainable by integrating the first function along a further (or second) horizontal line $h_1$ crossing at least one of the compensation regions 6 (pn-junction 14) of the active area 110 at the vertical distance $d_z$ and having a length equal to the first horizontal pitch $w_p$ or an integer multiple thereof. Except for the integration region (line) of the line integral, the same definition may be used for the doping bias $L_v$ of the active area 110 and doping bias $L_h$ of the peripheral area 120. In particular, the corresponding line integrals may be obtained for horizontal lines $h_1$, $h_2$ of same width (e.g., $w_p$).

The doping bias $L_v$ of the active area 110 does not (or at least substantially not, i.e., by at most 10%, typically by at most 5% and even more typically by at most 1%) vary in the horizontal direction to ensure sufficient charge-compensation in each horizontal section of the compensation structure 1, 6.

According to numerical simulations, the risk of an unwanted breakdown in the peripheral area 120 of the compensation device 100 is particularly strongly reduced when the doping bias $L_v$ of the active area 110 as function of the vertical distance $d_z$ from the first surface 101 changes in a similar manner as the doping bias $L_h$ of the peripheral area 120 as function of the distance from the active area 110. This is due to resulting in a particularly good spreading of the electric field lines both in vertical and horizontal direction during the blocking mode.

In the following, the doping bias $L_v$ of the active area 110 is also referred to as second doping bias $L_v$ and vertical doping bias $L_v$, respectively.

In one embodiment, the doping bias $L_v$ of the active area 110 changes as function of the vertical distance $d_z$ its sign from one to minus one once.

Figure 3:
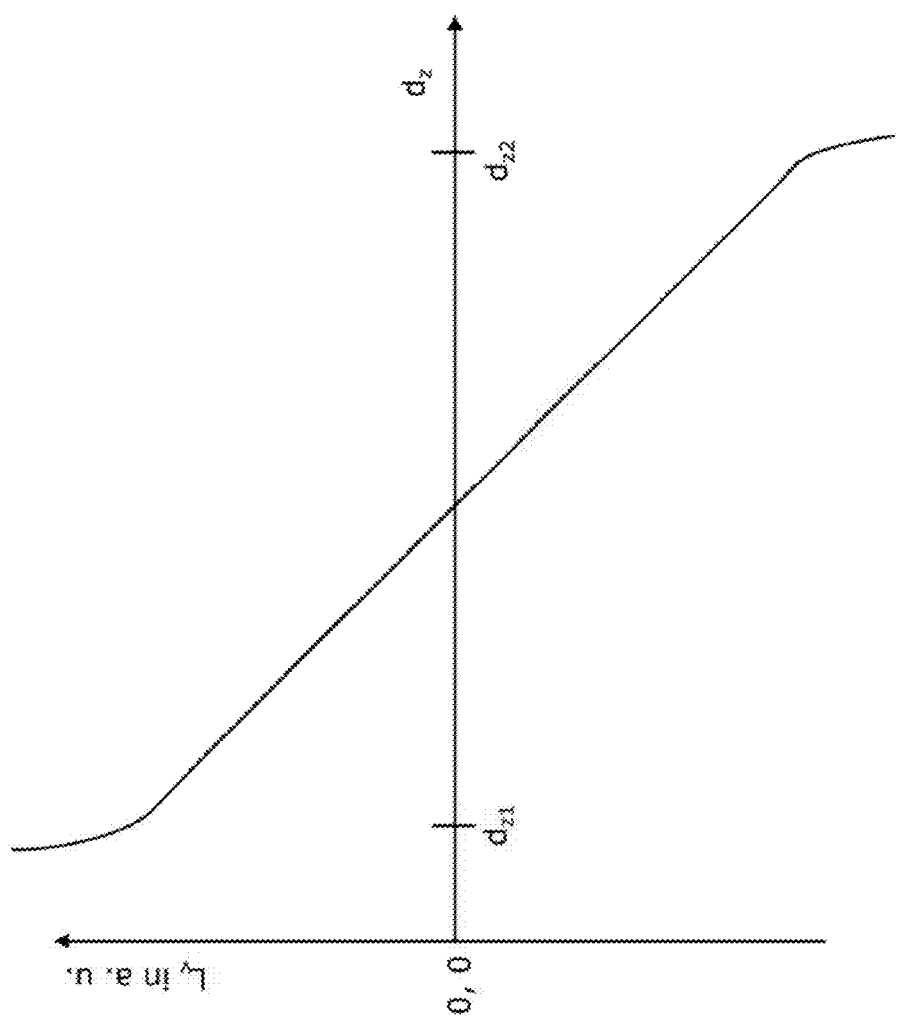
FIG. 3 illustrates a second doping-bias as function of a vertical distance from a first surface of a semiconductor body, according to an embodiment.

As illustrated in FIG. 3, the doping bias $L_v$ of the active area 110 is typically a monotonic function of the vertical distance $d_z$, more typically linearly decreasing with the vertical distance $d_z$ along the compensation regions 6, i.e., from the first vertical distance $d_{z1}$ to the second vertical distance $d_{z2}$.

To achieve a higher breakdown voltage in the peripheral area 120 compared to the active area 110, a slope of the doping bias $L_v$ ($d_z$) of the active area 110 as function of the vertical distance $d_z$ should be smaller (higher in absolute terms) than a slope of the doping bias $L_h$ ($d_x$) of the peripheral area 120 as function of the distance $d_x$ from the active area 110 in the corresponding linear portions between $d_{z1}$ and $d_{z2}$, and between $d_{x1}$ and $d_{x2}$, respectively.

For the same reason, the doping bias $L_v$ ($d_z/(d_{z2}-d_{z1})$) of the active area 110 between $d_{z1}$ and $d_{z2}$ may substantially corresponds to $L_h$ ($d_x/(d_{x2}-d_{x1})$) between $d_{x1}$ and $d_{x2}$ times a scaling factor which is at least one, typically larger than 1.

Figure 4:
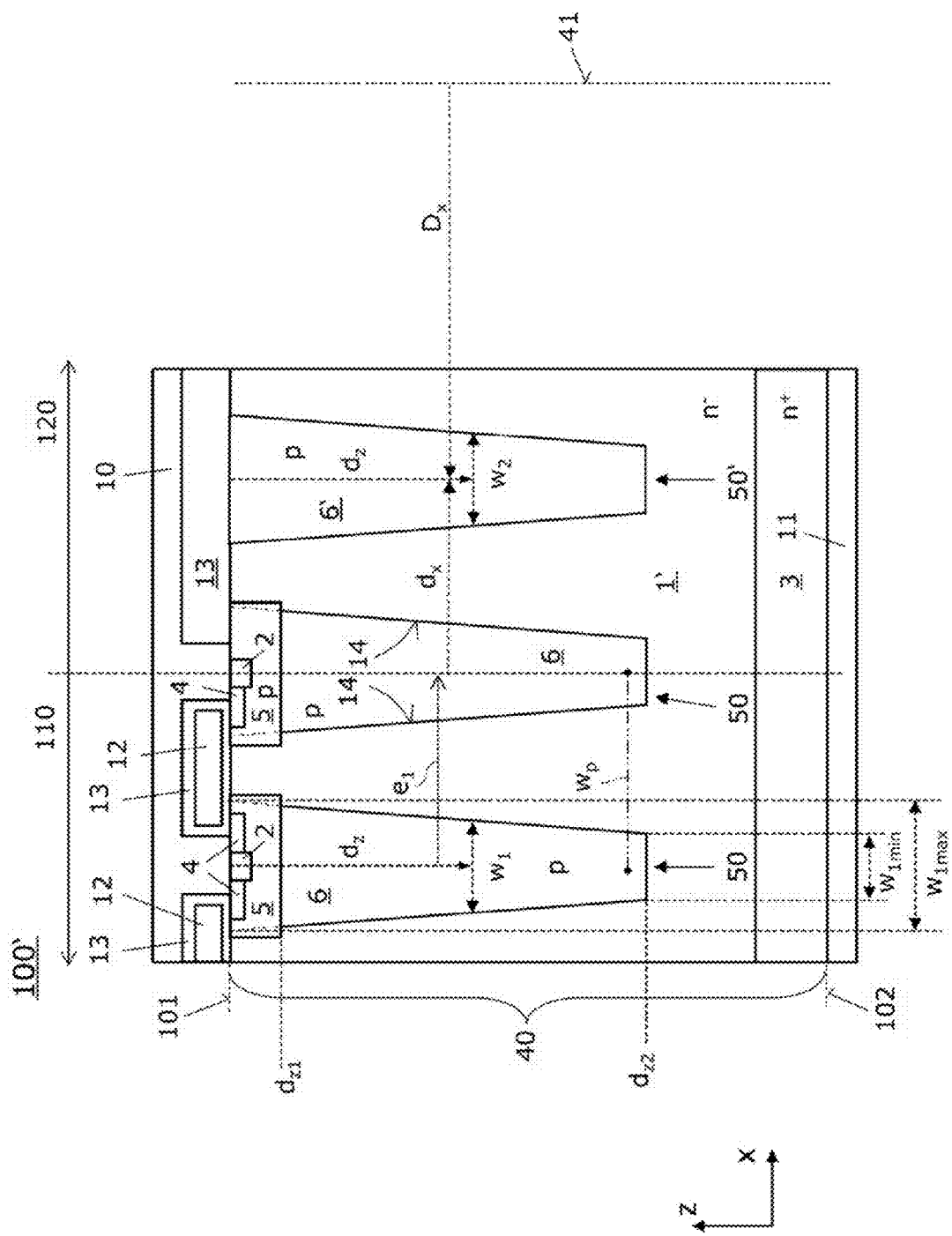
FIG. 4 illustrates a vertical cross-section through a semiconductor body of a semiconductor device, according to an embodiment.

FIG. 4 illustrates a section of a vertical cross-section through a semiconductor body 40 of a charge-compensation semiconductor device 100'. The charge-compensation semiconductor device 100' is similar to the semiconductor device 100 explained above with regard to FIGS. 1 to 4. For sake of clarity, FIG. 4 illustrates an enlarged view of a section with two first compensation regions 6 of the active area 110 and one second compensation regions 6' of the peripheral area 120.

As explained above, (n-type) source regions 4 in Ohmic contact with the source metallization 10 are embedded in the body regions 5 of the active area 110.

Further, the body regions 5 may be in Ohmic contact with the source metallization 10 via higher doped (p-doped in the exemplary embodiment) body contact regions 2 arranged between the source metallization 10 and a respective body region 5.

In the exemplary embodiment, the first compensation regions 6 are arranged in (first) tapered trenches 50 and the second compensation regions 6' are arranged in (second) tapered trenches 50'. While all first tapered trenches 50 may, in the vertical cross-section, have the same geometry, a width $w_2$ at given vertical distance $d_z$ of the second tapered trenches 50' may vary in y-direction perpendicular to the drawing plane and/or in dependency of respective distance $d_x$ and $D_x$ of the trench 50' in x-direction.

As indicated by the dashed-dotted lines in the body regions 5, the body regions 5 may be partially arranged in a respective upper portion of the first tapered trenches 50 extending to the first surface 101. Accordingly, the first tapered trenches 50 may have, in the vertical cross-section, a maximum horizontal extension $w_{1max}$ at the first surface 101 and a minimum horizontal extension $w_{1min}$ at the vertical depth $d_{z2}$.

In the trenches 50, 50', compensation regions 6, 6' are arranged. The compensation regions 6, 6' are typically formed using epitaxial deposition and may have the same (p-type) doping.

The body regions 5, body contact regions 2 and source regions 4 may be formed by masked implanting of dopant ions into the upper portions of the first tapered trenches 50 and subsequent annealing.

Due to reducing the width $w_1$ of the first tapered trenches 50 and the width $w_2$ of the second tapered trench(es) 50' with increasing vertical distance $d_z$, the doping bias is linearly reduced with vertical distance $d_z$ both in the active area 110 and the peripheral area 120 when the doping of the compensation regions 6, 6' is (substantially) constant and the doping of the drift portions 1 is (substantially) constant.

To achieve a further desired reduction of the doping bias in the peripheral area with increasing distance $d_x$ from the active area 110 (reducing distance $D_x$ from the edge 41), the width $w_2$ of the second tapered trenches 50' (at given vertical distance $d_z$) may be reduced linearly with the distance $d_x$ and number of the second tapered trenches 50' counted from the active area 110, respectively.

As trench etching may be performed with low variations and the doping may be well controlled during epitaxial processes used for forming the compensation regions 6, 6' and for forming the drift region 1' on the higher doped substrate 3 typically forming a drain region 3, a low overall process variation may be obtained.

Furthermore, it turns out that any process variation in epitaxially forming the compensation regions 6, 6' tends to influence the doping bias in the active area 110 and the peripheral area 120 in the same manner. This is illustrated in FIG. 5.

Figure 5:
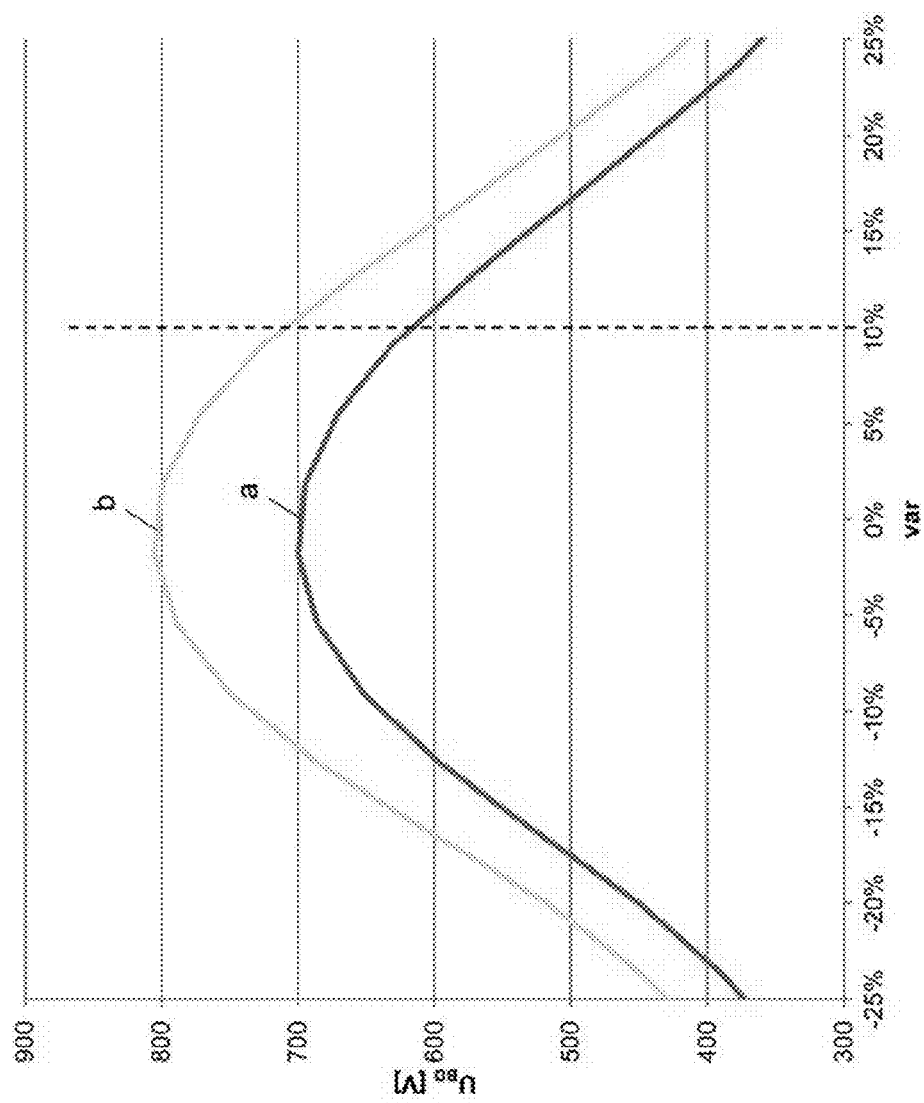
FIG. 5 illustrates a breakdown voltage of a semiconductor device, according to an embodiment.

The curves a and b of FIG. 5 correspond to breakdown voltage $U_{BD}$ in the active area (curve a) and the peripheral area (curve b) as function of processing variability var for charge-compensation semiconductor devices as explained above with regard to FIG. 1 to FIG. 4. In the exemplary embodiment and assuming ideal manufacturing, the breakdown voltage of the active area and the semiconductor device, respectively, is designed to be 700 V, and the breakdown voltage of the peripheral area is designed to be higher (about 800 V). When the doping of the charge-compensation structures (trench-fillings) is increased by e.g., 10% during manufacturing, the breakdown voltage of the active area and the breakdown voltage of the peripheral area are reduced as indicated by the dashed line in FIG. 5. This results in rescaling the doping bias of the active area as function of the vertical distance and the doping bias of the peripheral area as function of the horizontal distance from the active area by the same factor. Accordingly, the correlation between the doping bias of the active area and the doping bias of the peripheral area is maintained. Thus, the breakdown voltage of the peripheral area remains higher than the breakdown voltage of the active area for any variation of the trench filling process.

In one embodiment, the charge-compensation semiconductor device 100' explained above with regard to FIG. 4 has a semiconductor body 40 including a first surface 101, a lateral edge 41 delimiting the semiconductor body 40 in a horizontal direction substantially parallel to the first surface 101, an active area 110, a peripheral area 120 arranged between the active area 110 and the lateral edge 41, a drift region 1, 1', and compensation regions 6, 6' arranged in respective tapered trenches 50, 50' and forming respective pn-junctions 14 with the drift region 1'. The compensation regions 6 in the active area 110 form a lattice having a first base vector $e_1$ of a first length $w_p$. In a vertical cross-section perpendicular to the first surface 101 (and parallel to the first base vector $e_1$), a horizontal width $w_2$ of the compensation regions 6' decreases in at least a portion of the peripheral area 120 with an increasing vertical distance $d_z$ from the first surface 101 and with a decreasing horizontal distance $D_x$ from the edge 41 (increasing distance $d_x$ from the active area 110). Further, a source metallization 10 is arranged on the first surface 101 in Ohmic contact with the compensation regions 6 in the active area 110, and a drain metallization 11 is arranged opposite to the source metallization 10 and in Ohmic contact with the drift region 1, 1'.

Typically, the horizontal width $w_2$ of the compensation regions 6' (trenches 50') decreases in the peripheral area 120 with an increasing vertical distance $d_z$ from the first surface 101 and with increasing distance from the active area 110 (decreasing horizontal distance from the edge 41) in two non-parallel horizontal directions, e.g., in two orthogonal horizontal directions. This ensures correlating the vertical doping bias of the active area with the horizontal doping bias of the peripheral area in two directions and thus designs for charge-compensation semiconductor devices which are particularly robust with regard to a shift of the breakdown voltage due to manufacturing variations. This is explained in more detail with regard to FIG. 6 to FIG. 9.

Figure 6:
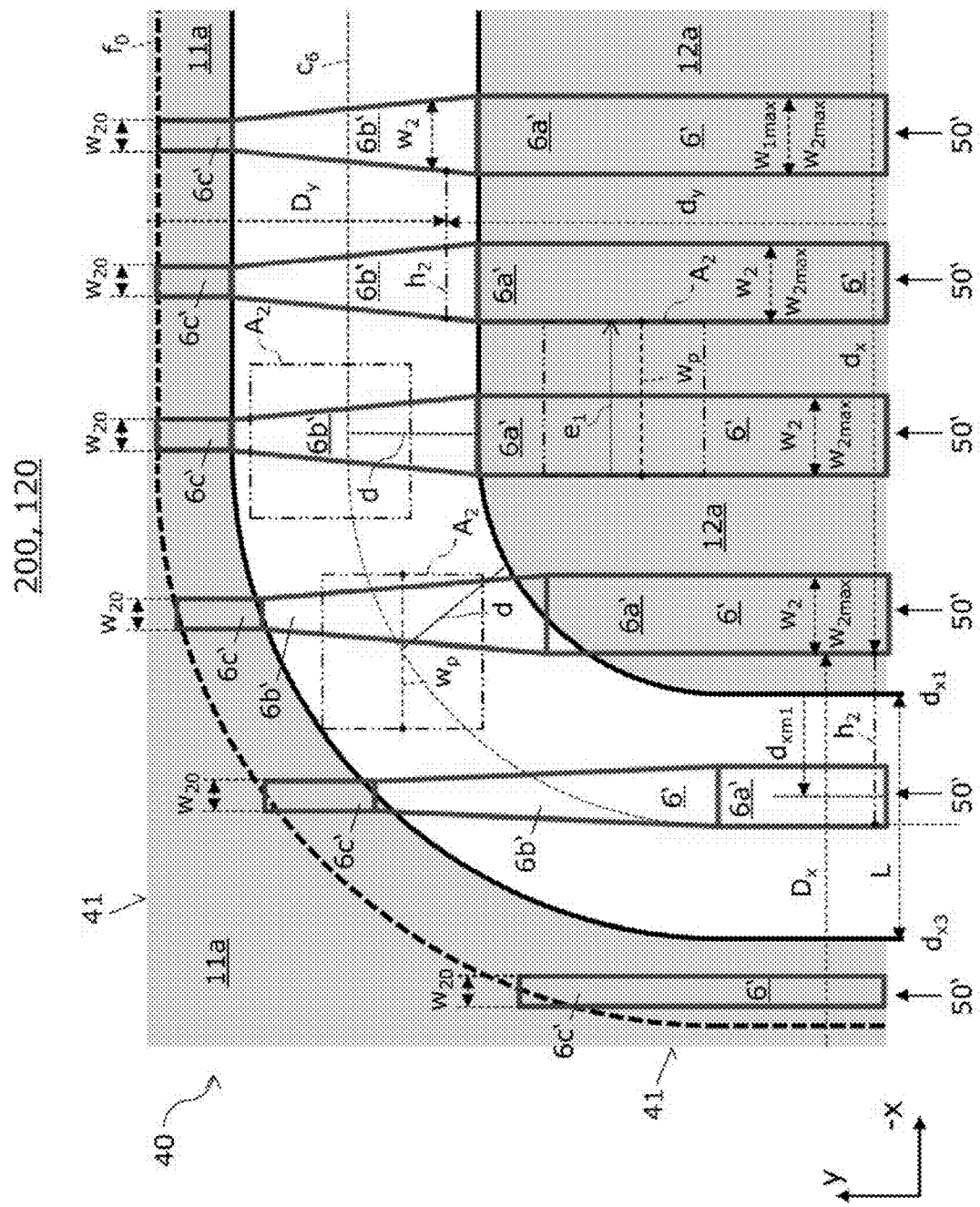
FIG. 6 illustrates a layout of a semiconductor device, according to an embodiment.

FIG. 6 illustrates a layout of a charge-compensation semiconductor device 200 according to an embodiment. The semiconductor device 200 is similar to the semiconductor devices explained above with regard to FIGS. 1 to 5. For sake of clarity only the layout of the conductive drain ring 11a, the conductive gate ring 12a and of the tapered trenches 50' and the second compensation regions 6', respectively, in a corner region of the peripheral area 120 of the semiconductor device 200 are shown. The active area of the semiconductor device 200 may in a vertical cross-section parallel to the x-direction correspond to the active area as shown in FIG. 4 or in FIG. 1 but with tapered trenches 50' having a horizontal width in x-direction which reduces with increasing vertical distance ($d_z$) from the first surface (101). The layout of the tapered trenches 50' and compensation regions 6', respectively, typically corresponds to the tapered trenches 50' and compensation regions 6' at the first surface of the semiconductor body 40 where the tapered trenches 50' and compensation regions 6' have, due to the taper, the largest area (size).

As indicated by the arrow $e_1$ in FIG. 6, the typically floating compensation regions 6' may form in vertical cross-sections parallel to the x-direction and beneath the conductive gate ring 12a a one-dimensional lattice (in the following also referred to as 1-d lattice) with a base vector $e_1$ that may correspond to a base vector of the compensation regions in the active area (beneath the source metallization).

In x-direction, a maximum width $w_{2max}$ of the compensation regions 6' which are at least partly arranged beneath the conductive gate ring 12a may correspond to a maximum width $w_{1max}$ in x-direction of the trenches in active area at the first surface.

To achieve the desired variation of the doping bias of the peripheral area 120 in horizontal directions, the width $w_2$, in x-direction, of the compensation regions 6' and the vertical trenches 50', respectively, is reduced between the conductive gate ring 12a and the conductive drain ring 11a.

In the exemplary embodiment, each of the compensation regions 6' (vertical trenches 50') which crosses in top view (projection onto the first surface) the inner border of the conductive drain ring 11a (are only partly arranged beneath the conductive drain ring 11a) has an outer portion 6c' arrange beneath the conductive drain ring 11a, a main portion 6a' and a horizontally tapered portion 6b' formed between the outer portion 6c' and the main portion 6a'. While the outer portion 6c' and the main portions 6a' have in top view a rectangular shape, the horizontally tapered portion 6b' are in top view shaped as a regular trapezoid with a width $w_2$ in x-direction that varies from a maximum value at the adjoining main portions 6a' to a minimum value $w_{20}$ at the adjoining outer portion 6c'.

The outer portion 6c' typically extends close to the edge 41, for example to a surface $f_0$ next to the edge 41 where the electric potential in the semiconductor body 40 is at least substantially at drain potential during device operation.

Due to the linearly reduced width $w_2$ of the horizontally tapered portion 6b' in x-direction with increased distance $d_y$ to the active area (reduced distance $D_y$ to the edge 41) in y-direction, the doping-bias of the peripheral area 120 varies between the conductive gate ring 12a and the conductive drain ring 11a linearly with horizontal co-ordinate y.

Furthermore, the doping-bias of the peripheral area 120 may vary between the conductive gate ring 12a and the conductive drain ring 11a as function of the horizontal co-ordinate x in the same manner. For this purpose, the width $w_2$ in x-direction of the main portions 6a', which are in top view completely arranged between the conductive gate ring 12a and the conductive drain ring 11a, may be chosen in dependence of a distance $d_{xm1}$ in x-direction between the conductive gate ring 12a and the respective main portions 6a', in particular in accordance with the equation:

$$w_2 = w_{2mas} - (w_{2max} - w_{20}) * d_{xm1}/L,$$

with L representing the (minimum) spacing between the conductive gate ring 12a and the conductive drain ring 11 in x-direction.

In so doing, closed iso-doping-bias curves $c_6$ may be formed surrounding the conductive gate ring 12a at substantially the same horizontal distance d (at and close to the first surface). Accordingly, a horizontally isotropic or almost horizontally isotropic electric field distribution during the blocking mode may be achieved.

For sake of clarity, only one of typically a plurality of compensation regions 6' with a main portion 6a', which is in top view completely arranged between the conductive gate ring 12a and the conductive drain ring 11a, is shown FIG. 6.

To achieve high robustness with regard to a shift of the breakdown voltage due to manufacturing variations, the minimum value $w_{20}$ (extension of the outer portion 6c' in x-direction at the first surface) may match the minimum horizontal extension ($w_{1min}$) of the tapered trenches in the active area, i.e., at the trench bottom and vertical depth ($d_{z2}$) of the trenches in the active area, respectively.

As illustrated in FIG. 6 by the squares $A_2$, the doping-bias of the peripheral area 120 may also defined as a surface integral obtainable by integrating the first function over an area of a cell $A_2$ which is arranged in the peripheral area 120, is parallel to (horizontally orientated) and has the same shape as a unit cell ($A_1$ not shown in FIG. 6) in the active area. This definition is more suitable for compensation-structures with compensation regions in the active area forming a two-dimensional lattice (in the following also referred to as 2-d lattice) in top view instead a one-dimensional lattice.

Accordingly, the second doping-bias ($L_v$) may also be defined as a surface integral obtainable by integrating the first function over an area of the unit cell ($A_1$) in the active area (110) and the first doping-bias ($L_h$) may be defined as a surface integral obtainable by integrating the first function over an area of a cell $A_2$ arranged in the peripheral area 120 an having the having the same shape as the unit cell $A_1$. This definition covers also all embodiments in which first compensation regions (6) in the active area (110) and/or the second compensation regions 6' in the peripheral area 120 form (are arranged on) a respective 2-d lattice and is such more general than the above given definitions using line integrals which is suited for 1-d lattices.

In embodiments referring to 1-d lattices, both definitions are typically equivalent and correspond to a rescaling, respectively.

For example, in embodiments referring to semiconductor devices having a compensation-structure with first compensation regions forming a one-dimensional lattice in the active area, the unit cell ($A_1$) may be defined as a square having edge length equal to the length of the base vector of the one-dimensional lattice. Such a definition corresponds to a rescaling compared to the definition of the doping-bias of the peripheral area 120 based on integrating the first function along a horizontal line $h_2$ by a constant factor (of e.g., the length of the base vector when the horizontal line $h_2$ has the same length as the base vector).

FIG. 7 illustrates a layout of a charge-compensation semiconductor device 200'. The semiconductor device 200' is similar to the semiconductor device 200 explained above with regard to FIG. 6. However, the elongation direction of the compensation regions 6' of semiconductor device 200' forms an acute angle with the edge(s) 41.

For sake of clarity only three of a plurality of second compensation regions 6' typically arranged the peripheral area 120 of the semiconductor device 200' are shown in FIG. 7.

Further, the compensation region(s) 6' extending in top view from the drain ring 11a to the drain ring 11 without crossing the gate ring 12a may only include two tapered portions 6b' and two outer portion 6c'.

Figure 8B:
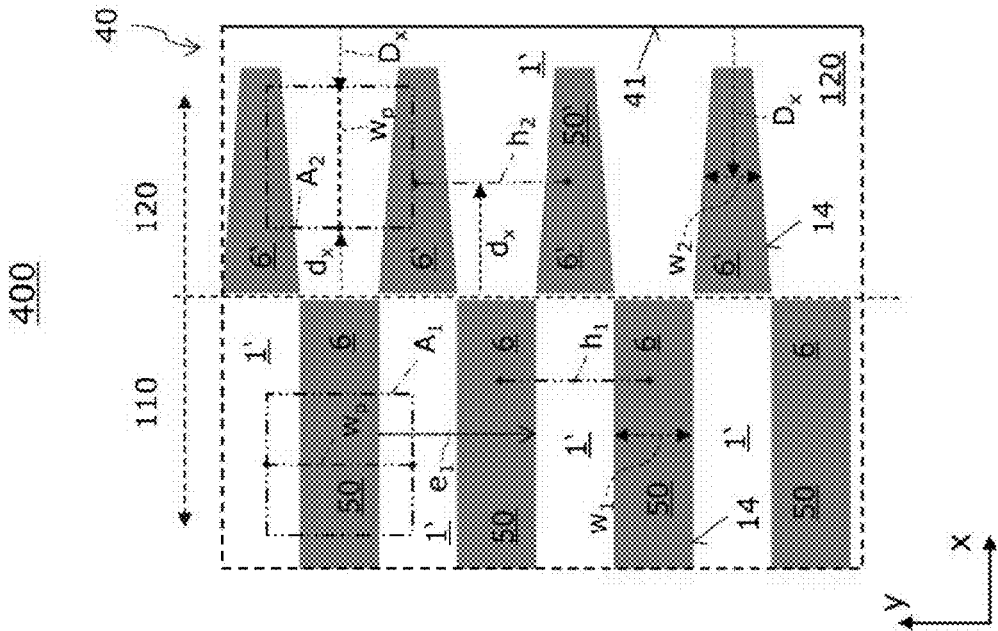
FIG. 8B illustrates a horizontal cross-section through a semiconductor body of the semiconductor device, according to an embodiment.
Figure 8A:
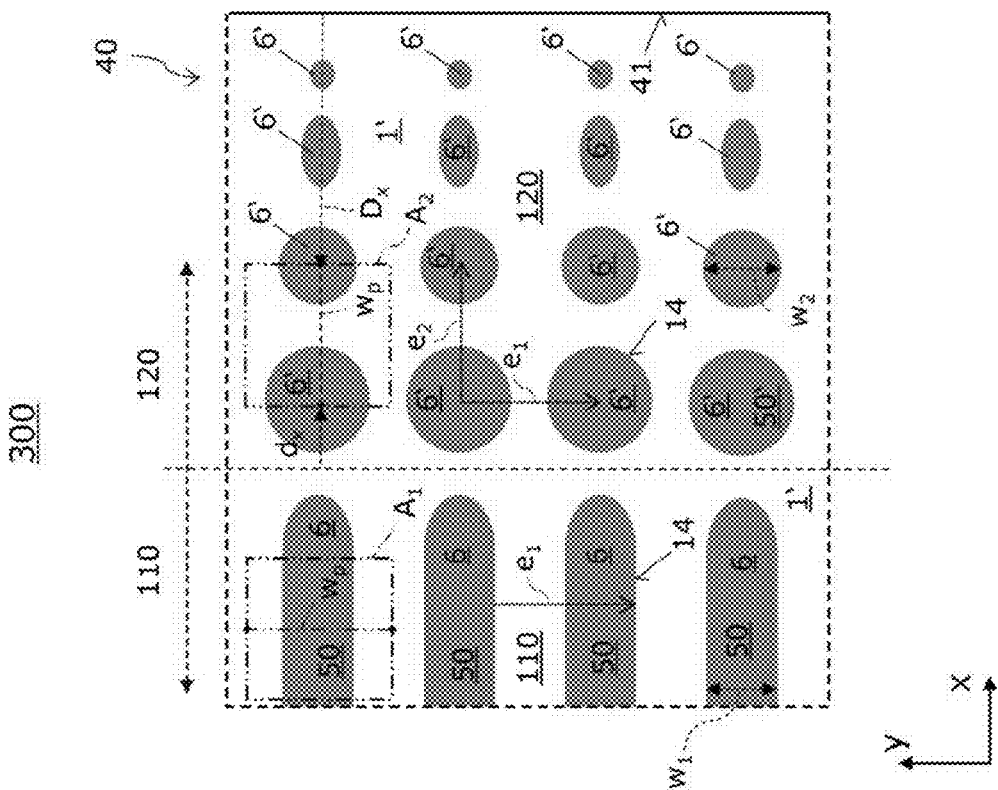
FIG. 8A illustrates a horizontal cross-section through a semiconductor body of the semiconductor device, according to an embodiment.

FIG. 8A illustrates a horizontal cross-section through a semiconductor body 40 of a charge-compensation semiconductor device 300 in a plane crossing the first compensation regions 6 of the active area 110 and the second compensation regions 6' of the peripheral area 120. The semiconductor device 300 is similar to the semiconductor devices explained above with regard to FIGS. 2 to 7.

In the exemplary embodiment, the first compensation regions 6 form a 1-d lattice with the a base vector $e_1$ of first length $w_p$ (pitch) and parallel to the y-direction, and the second compensation regions 6' are arranged on a 2-d lattice with two orthogonal base vectors $e_1$, $e_2$ of same length $w_p$ (square lattice). The width $w_1$ of the first compensation regions 6 in direction of the base vector $e_1$ may be constant or as shown in FIG. 8A constant except for a the thin border region at the peripheral area 120 typically having a width of less than about $w_p/2$. Different thereto, the maximum horizontal widths $w_2$ of the second compensation regions 6' decreases, in direction of the second base vector $e_2$ (x-direction), with the distance $d_x$ of the second compensation regions 6' from the border to the active area 110 and decreasing distance $D_x$ to the edge 41, respectively.

Typically, the area percentage of the second compensation regions 6' in the peripheral area 120 decreases, when averaged over a unit cell $A_2$ of the peripheral area 120, substantially linear in direction of the second base vector $e_2$ (x-direction) with the distance $d_x$ of the second compensation regions 6' from the border to the active area 110 and decreasing distance $D_x$ to the edge 41, respectively.

FIG. 8B illustrates a horizontal cross-section through a semiconductor body 40 of a charge-compensation semiconductor device 400 in a plane crossing first compensation regions 6 of the active area 110 and second compensation regions 6' of the peripheral area 110.

The semiconductor device 400 is similar to the semiconductor device 300 explained above with regard to FIG. 8A. However, the second compensation regions 6' of the semiconductor device 400 are arranged on a 1-d lattice with the same base vector $e_1$ as the first compensation regions 6. Both 1-d lattices may be shifted in direction of the common base vector $e_1$.

In the exemplary embodiment, the horizontal width $w_2$ of each of the second compensation regions 6' decreases linearly with increasing distance $d_x$, in direction perpendicular to the base vector e1 (x-direction), from the border to the active area 110 and decreasing distance $D_x$ to the edge 41, respectively.

Figure 9:
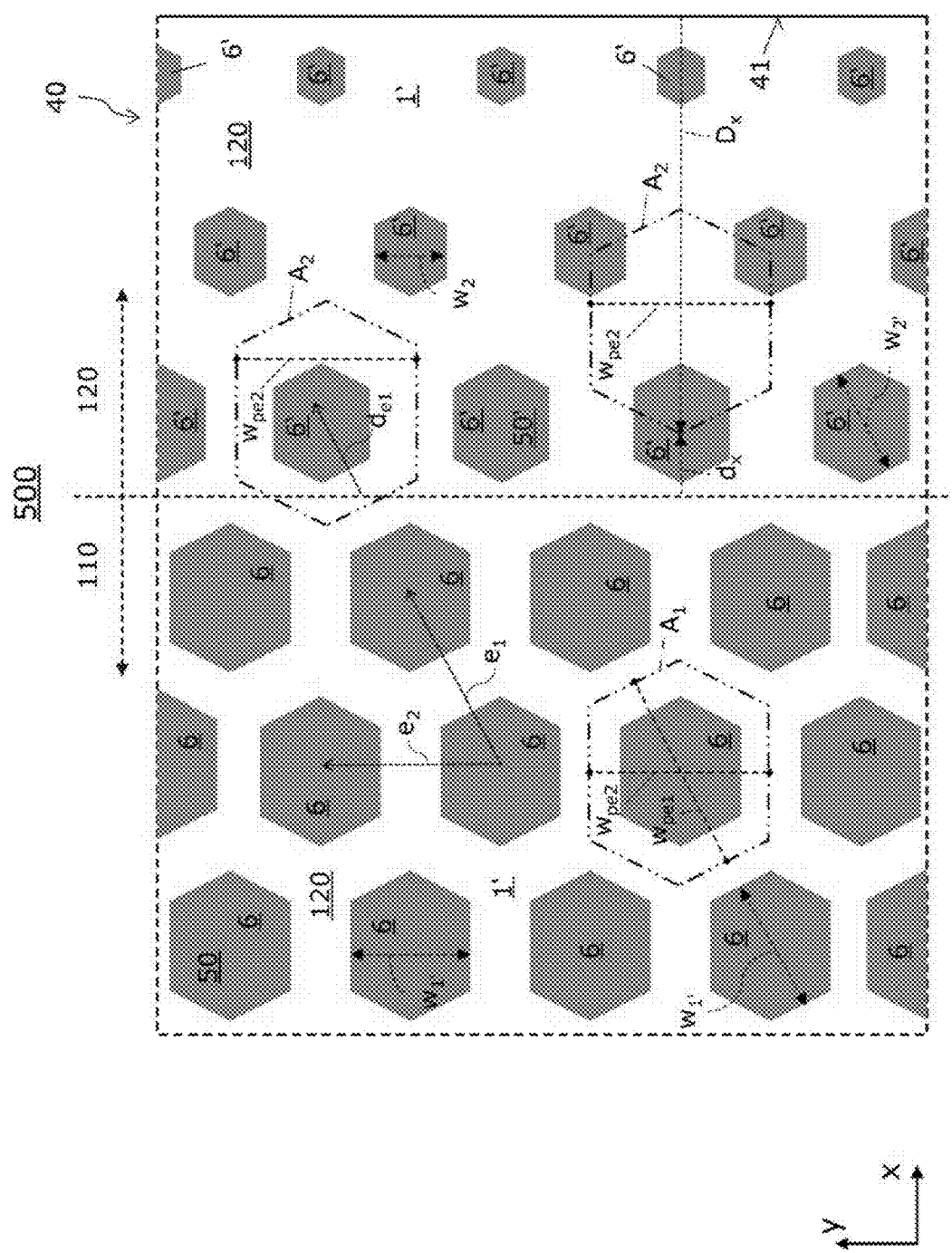
FIG. 9 illustrates a horizontal cross-section through the semiconductor body of the semiconductor device, according to an embodiment.

FIG. 9 illustrates a horizontal cross-section through a semiconductor body 40 of a charge-compensation semiconductor device 500 in a plane crossing first compensation regions 6 of the active area 110 and second compensation regions 6' of the peripheral area 110.

The semiconductor device 500 is similar to the semiconductor device 300 explained above with regard to FIG. 8A. However, the first and second compensation regions 6, 6' of the semiconductor device 500 are arranged on (form) a respective hexagonal 2-d lattice with the same base vectors $e_1$, $e_2$. The first and second compensation regions 6, 6' of the semiconductor device 500 may even form a common 2-d lattice.

In the exemplary embodiment, the two-dimensional unit cells $A_1$, $A_2$ of the active area 110 and the peripheral area 120, respectively, are formed by regular hexagons with extensions $w_{pe1}$, $w_{pe2}$ in directions of the base vectors $e_1$ and $e_2$, respectively.

The widths $w_1$, $w_{1'}$ of the first hexagonal compensation regions 6 in indirection of the base vectors $e_1$ and $e_2$, respectively, are constant.

Different thereto, the widths $w_2$, $w_{2'}$ of the second hexagonal compensation regions 6 in directions of the base vectors $e_1$ and $e_2$, respectively, reduces with increasing distance $d_{e1}$ (in direction of the base vector $e_1$), $d_x$ (in x-direction) from the active area 110 and decreasing distance $D_x$ from the edge 41, typically in a linear manner in a major portion of the peripheral area 120.

Accordingly, the first doping-bias ($L_{f_h}$) as a function of horizontal distances $d_x$, $d_{e2}$ changes, in the semiconductor body 40 and at vertical distances from the first surface of less than about two times the length ($w_{pe2}$) of the larger of the two basis vectors $e_1$, $e_2$, its sign from one to minus one, wherein the first doping-bias ($L_{f_h}$) is defined as a surface integral determined by integrating the first function over an area of a cell $A_2$ arranged in the peripheral area 120 and having the same shape as the unit cell $A_1$ of the active area 110. The cell $A_2$ may even be a unit cell of a 2d-lattice of the peripheral area 120 and a major portion of the peripheral area 120, respectively.

Charge-compensation semiconductor devices may be produced with a so-called 'multiple epitaxy' process. In this case, an n-doped epitaxial layer, which may be several μm thick, is first grown on a highly n-doped substrate and commonly referred to as 'buffer epi'. In addition to a doping level introduced in the epitaxial step doping ions are introduced into the buffer epi through a mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type charge-compensation regions (compensation regions) and n-type charge-compensation regions (drift portions). The manufacturing of the actual devices can then be conducted at this point.

Another technique for fabricating charge-compensation semiconductor devices involves trench etching and compensation with trench filling. The volume which absorbs the voltage is deposited in a single epitaxial step (n-doped epi) on a highly n-doped substrate, so that the thickness corresponds to the total thickness of the multilayered epitaxial structure. After that, deep trenches are etched, which determine the form of the p-columns (compensation regions). The deep trenches are then filled with p-doped epi which is at least substantially free of crystal defects.

Both techniques may be used to manufacture the charge-compensation semiconductor devices as explained above with regard to FIGS. 1 to 9.

With regard to FIG. 10A to FIG. 10D method steps of a method using the trench based technique for manufacturing a charge-compensation semiconductor device are explained in respective vertical cross-sections.

Figure 10A:
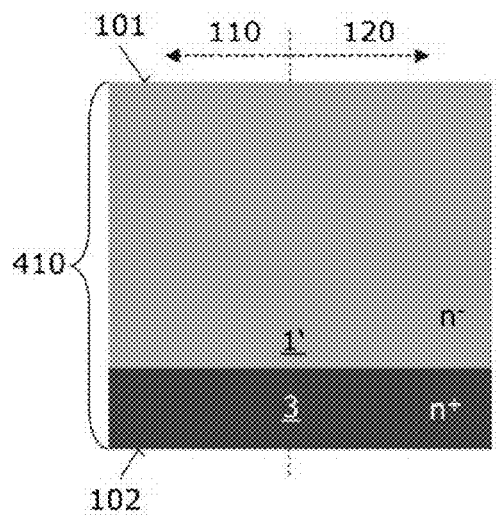
FIG. 10A to FIG. 10D illustrates vertical cross-sections through a semiconductor body during method steps of a method, according to embodiments.

In a first step, a wafer 410 having a first surface 101 and an n-type drift region 1' extending to the first surface 101 is provided. In embodiments referring to manufacturing of silicon semiconductor devices, the first surface 101 may e.g., be a (1 0 0) surface or a (0 0 1) surface. This facilitates the later epitaxial deposition. As shown in FIG. 10A, the drift region 1' may be arranged on a higher n-doped drain region 3, e.g., formed by one or more epitaxial layer(s) 1' deposited on a highly doped substrate 3.

Thereafter, active device areas 110 which are surrounded by corresponding peripheral device areas 120 are defined. FIG. 10A illustrates a right section of the active area 110 and the peripheral area 120 of one semiconductor device of a plurality of semiconductor devices to be manufactured in parallel on wafer-level.

Thereafter, tapered trenches 50, 50', i.e., trenches having sidewalls which are inclined with respect to the first surface 101, may be etched from the first surface 101 into the drift region 1' using a mask 17. This is performed such that the tapered trenches 50 have in the active area 110 a first horizontal width w1 which decreases with an increasing vertical distance dz from the first surface 101, and that the tapered trenches 50 have in the peripheral area 120 a second horizontal width $w_2$ which decreases with increasing vertical distance dz from the first surface 101 and with an increasing horizontal distance dh from the active area 110 (decreasing horizontal distance from a scribe line not shown in FIG. 10B).

For example, the second horizontal widths $w_2$ of a sequence of tapered trench 50 in the peripheral area 120 may, at same vertical distance dz, decrease with the horizontal distance dh from the active area 110. Typically, the second horizontal widths w2, at the same vertical distance dz, of the sequence of tapered trench 50 decrease in a portion of the peripheral area 120 linearly with the horizontal distance dh from the active area 110.

Figure 10B:
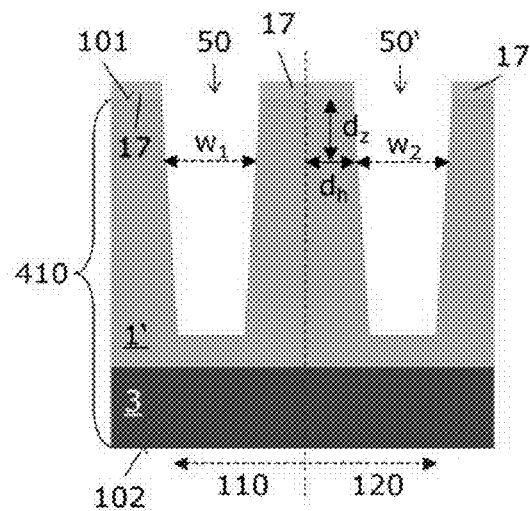

Furthermore, the horizontal width $w_2$, at given vertical distance $d_{z1}$ of a tapered trench 50' in the peripheral area 120 may also decrease in a direction pointing out of the drawing plane of FIG. 10B.

Figure 10C:
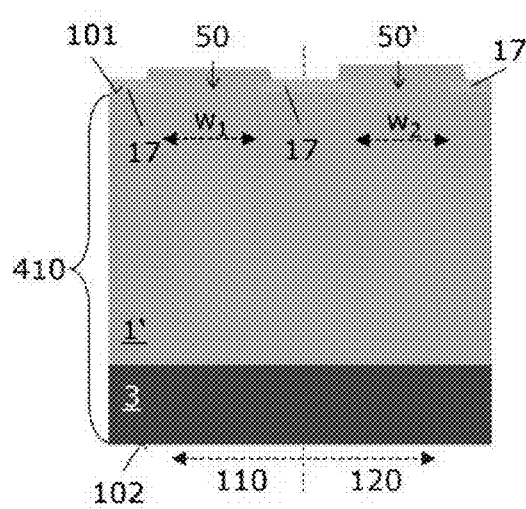
Figure 10D:
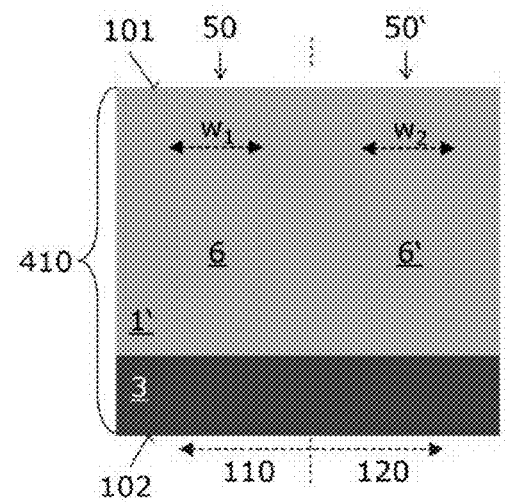

Thereafter, the trenches 50 may be filled with p-doped substantially monocrystalline semiconductor material to form compensation regions 6, 6' using selective epitaxial depositing and a subsequent polishing at the first surface 101, e.g., a CMP-process (Chemical-Mechanical Polishing) as illustrated with regard to FIGS. 10C and 10D.

Thereafter, acceptor ions may be implanted next to the first surface 101 and into upper portions of the p-doped compensation regions 6 in the active area 110 to form higher doped body regions and body contact regions, respectively. Further, donor ions may be implanted next to the first surface 101 and into body regions 5 to form source regions.

After a subsequent thermal process to activate and potentially drive in the implanted ions, a source metallization in Ohmic contact with the compensation regions 6 and the source regions may be formed on the first surface 101 in the active area.

Further, a drain ring and/or a gate ring arranged between the drain ring and the active device area may be formed on the first surface 101 in the peripheral device area(s) 120.

Even further, insulated gate electrodes may be formed next the first surface 101 in the active device area(s) 110.

Thereafter, a drain metallization may be formed on the back-side 102 (opposite to the source metallization) and in Ohmic contact with the drift region 1 and drift portions 1, respectively.

Thereafter, the wafer 410 may be separated, e.g., by sawing along sawing or scribe lines, into individual charge-compensation semiconductor devices, so that the charge-compensation semiconductor devices have a corresponding lateral edge which delimits the charge-compensation semiconductor device in a horizontal direction substantially parallel to the first surface 101.

In one embodiment, the method includes: providing a wafer 410 including a first surface 101 and a drift region 1' of a first conductivity type extending to the first surface 101; defining an active area 110 and a peripheral area 120 surrounding the active area 110; etching in the active area 110 and in the peripheral area 120 tapered trenches 50 from the first surface 101 into the drift region 1' so that the tapered trenches 50 in the active area 110 have a first horizontal width w1 which decreases with an increasing vertical distance dz from the first surface 101, and that a second horizontal width w2 of the tapered trenches 50 in the peripheral area 120 decreases with increasing vertical distance dz from the first surface 101 and with an increasing horizontal distance from the active area 110; forming compensation regions 6, 6' including epitaxial depositing a semiconductor material of a second conductivity type in the tapered trenches 50 of the active area 110 and the peripheral area 120; forming in the active area 110 a source metallization 10 on the first surface 101 in Ohmic contact with the compensation regions 6; and forming a drain metallization 11 opposite to the source metallization 10 and in Ohmic contact with the drift region 1'.

After further separating the wafer 410 into individual chis, charge-compensation semiconductor devices are obtained. In one embodiment, the charge-compensation semiconductor device(s) includes in a vertical cross-section a semiconductor body having a first surface 101, a lateral edge 41 delimiting the semiconductor body 40 in a horizontal direction substantially parallel to the first surface 101, an active area 110, a peripheral area 120 arranged between the active area 110 and the lateral edge 41, a drift region 1', first compensation regions 6 forming respective first pn-junctions 14 with the drift region 1' and second compensation regions 6' extending from the first surface 101 into the drift region 1' and forming respective second pn-junctions 14 with the drift region 1'. The first compensation regions 6 form in the active area 110 a lattice comprising a first base vector having a first length (wp). The second compensation 6' have, in the horizontal direction a horizontal width w2 which decreases with an increasing vertical distance dz from the first surface 101 and with a decreasing horizontal distance from the edge (41).

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A charge-compensation semiconductor device, comprising:
   a semiconductor body comprising:
   a first surface;
   a lateral edge delimiting the semiconductor body in a horizontal direction substantially parallel to the first surface;
   an active area, a peripheral area arranged between the active area and the lateral edge;
   a drift region;
   compensation regions each of which forms a respective pn-junction with the drift region, wherein the compensation regions form in the active area a lattice comprising a first base vector having a first length, and wherein, in a vertical cross-section perpendicular to the first surface, a horizontal width of the compensation regions decreases in the peripheral area with an increasing vertical distance from the first surface and with a decreasing horizontal distance from the edge;
   a source metallization arranged on the first surface in Ohmic contact with the compensation regions in the active area; and
   a drain metallization opposite to the source metallization and in Ohmic contact with the drift region,
   wherein a first doping-bias as a function of a horizontal distance from the lateral edge changes its sign from minus one to one, the first doping-bias being defined as an integral obtainable by integrating a first function along a horizontal line arranged at the horizontal distance from the lateral edge, crossing at least one of the pn-junctions, and having a length equal to the first length or an integer multiple thereof, the first function being defined as a difference between a concentration of p-type dopants in the semiconductor body and a concentration of n-type dopants in the semiconductor body.

2. The charge-compensation semiconductor device of claim 1, wherein the compensation regions have in the active area a further horizontal width which decreases with increasing vertical distance from the first surface.

3. A charge-compensation semiconductor device, comprising:
   a semiconductor body comprising a semiconductor material, a first surface, a lateral edge delimiting the semiconductor body in a horizontal direction substantially parallel to the first surface, an active area, a peripheral area arranged between the active area and the lateral edge, and a drift region comprising first dopants providing a first number of first charge carriers per unit in the semiconductor material;
   a source metallization arranged on the first surface; and
   a drain metallization arranged opposite to the source metallization and in Ohmic contact with the drift region;
   wherein the semiconductor body further comprises, in a vertical cross-section substantially perpendicular to the first surface, compensation regions which alternate with portions of the drift region in the active area and in the peripheral area, have at least in the active area a first horizontal pitch, and comprise second dopants providing a second number of second charge carriers per unit in the semiconductor material, the second charge carriers being different to the first charge carriers, wherein the compensation regions of the active area are in Ohmic contact with the source metallization, and wherein a first doping-bias as a function of a horizontal distance from the active area changes its sign from one to minus one, the first doping-bias being defined as an integral obtainable by integrating a first function along a horizontal line arranged in the peripheral area at the horizontal distance from the active area and having a length equal to the first horizontal pitch or an integer multiple thereof, the first function being defined as a difference between a concentration of the second dopants multiplied by the second number and a concentration of the first dopants multiplied by the first number.

4. The charge-compensation semiconductor device of claim 3, wherein the first doping-bias is a monotonically decreasing function of the horizontal distance.

5. The charge-compensation semiconductor device of claim 3, wherein a second doping-bias as a function of a vertical distance from the first surface changes its sign from one to minus one, the second doping-bias being defined as an integral obtainable by integrating the first function along a further horizontal line crossing one of the compensation regions of the active area at the vertical distance from the first surface and having a length equal to the first horizontal pitch or an integer multiple thereof.

6. The charge-compensation semiconductor device of claim 5, wherein the second doping-bias is a monotonically decreasing function of the vertical distance.

7. The charge-compensation semiconductor device of claim 5, wherein the compensation regions of the active area extend in a vertical direction from a first vertical distance to a second vertical distance, and wherein the second doping-bias is substantially linear between the first vertical distance and the second vertical distance.

8. The charge-compensation semiconductor device of claim 3, further comprising a conductive drain ring arranged on the first surface and in Ohmic contact with the drain metallization, and a conductive gate ring arranged on the first surface and between the conductive drain ring and the active device area, wherein the conductive gate ring extends in the vertical cross-section to a first horizontal distance, wherein the conductive drain ring extends in the vertical cross-section and the peripheral area to a second horizontal distance ($d_{x3}$, $d_{x4}$), and wherein the first doping-bias is substantially linear between the first horizontal distance and the second horizontal distance.

9. The charge-compensation semiconductor device of claim 3, wherein a first horizontal width of the compensation regions decreases with the vertical distance; and/or wherein a second horizontal width of the compensation regions in the peripheral area decreases with a decreasing distance from the edge.

10. The charge-compensation semiconductor device of claim 3, wherein a distance of the horizontal line from the first surface is less than about two times the first horizontal pitch.

11. The charge-compensation semiconductor device of claim 8, wherein, from a plan view perspective of the device in which outlines of the compensation regions are projected onto the first surface, several compensation regions in the peripheral area cross the conductive gate ring and the conductive drain ring and have a decreasing horizontal width between the conductive gate ring and the conductive drain ring.

12. The charge-compensation semiconductor device of claim 3, wherein each of the compensation regions in the active area and each of the compensation regions in the peripheral area is arranged in a respective tapered trench.

13. A charge-compensation semiconductor device, comprising:
a semiconductor body comprising a first surface, a lateral edge delimiting the semiconductor body in a horizontal direction substantially parallel to the first surface, an active area, a peripheral area arranged between the active area and the lateral edge, and a drift region comprising a semiconductor material and first dopants providing a first number of first charge carriers per unit in the semiconductor material;
a source metallization arranged on the first surface; and
a drain metallization arranged opposite to the source metallization and in Ohmic contact with the drift region;
wherein the semiconductor body further comprises, in horizontal cross-sections substantially parallel to the first surface, compensation regions each of which forms a pn-junction with the drift region and comprises the semiconductor material and second dopants providing a second number of second charge carriers per unit in the semiconductor material,
wherein the compensation regions in the active area are in Ohmic contact with the source metallization and form in each of the horizontal cross-sections a lattice having a unit cell comprising a common first base vector of a first length, and
wherein a first doping-bias as a function of a horizontal distance from the active area changes its sign from one to minus one, the first doping-bias being defined as a surface integral obtainable by integrating a first function over an area of a cell arranged in the peripheral area, at a distance from the first surface of less than about two times the first length and having the same shape as the unit cell, the first function being defined as a difference between a concentration of the second dopants multiplied by the second number and a concentration of the first dopants multiplied by the first number.

14. The charge-compensation semiconductor device of claim 13, wherein a second doping-bias as a function of the vertical distance changes its sign from one to minus one, the second doping-bias being defined as a surface integral obtainable by integrating the first function over an area of the unit cell.

15. The charge-compensation semiconductor device of claim 13, wherein the compensation regions form at least in a central portion of the active area a one-dimensional lattice, and wherein the unit cell is defined as a square having an edge length equal to the first length.

16. The charge-compensation semiconductor device of claim 13, wherein the compensation regions form at least in a central portion of the active area a hexagonal lattice.

17. A charge-compensation semiconductor device, comprising:
a semiconductor body comprising:
a first surface;
a lateral edge delimiting the semiconductor body in a horizontal direction substantially parallel to the first surface;

an active area, a peripheral area arranged between the active area and the lateral edge;

a drift region; and compensation regions each of which forms a respective pn-junction with the drift region, wherein the compensation regions form in the active area a lattice comprising a first base vector having a first length, and wherein, in a vertical cross-section perpendicular to the first surface, a horizontal width of the compensation regions decreases in the peripheral area with an increasing vertical distance from the first surface and with a decreasing horizontal distance from the edge;

a source metallization arranged on the first surface in Ohmic contact with the compensation regions in the active area;

a drain metallization opposite to the source metallization and in Ohmic contact with the drift region; and a conductive drain ring arranged on the first surface and in Ohmic contact with the drain metallization, and a conductive gate ring arranged on the first surface between the conductive drain ring and the source metallization and insulated from the semiconductor body the source metallization and the drain metallization, wherein the conductive gate ring has in the vertical cross-section a minimum horizontal distance from the lateral edge, wherein the conductive drain ring has a maximum horizontal distance from the lateral edge, and wherein a first doping-bias as a function of a horizontal distance from the lateral edge is substantially linear between the minimum horizontal distance and the maximum horizontal distance.

18. A charge-compensation semiconductor device, comprising:

a semiconductor body comprising:

a first surface;

a lateral edge delimiting the semiconductor body in a horizontal direction substantially parallel to the first surface;

an active area, a peripheral area arranged between the active area and the lateral edge;

a drift region; and compensation regions each of which forms a respective pn-junction with the drift region, wherein the compensation regions form in the active area a lattice comprising a first base vector having a first length, and wherein, in a vertical cross-section perpendicular to the first surface, a horizontal width of the compensation regions decreases in the peripheral area with an increasing vertical distance from the first surface and with a decreasing horizontal distance from the edge;

a source metallization arranged on the first surface in Ohmic contact with the compensation regions in the active area;

a drain metallization opposite to the source metallization and in Ohmic contact with the drift region, wherein a second doping-bias as a function of a vertical distance from the first surface changes its sign from one to minus one, the second doping-bias being defined as an integral obtainable by integrating a first function along a first horizontal line crossing one of the compensation regions of the active area at the vertical distance from the first surface and having a length equal to a first horizontal pitch of the compensation regions or an integer multiple thereof, the first function being defined as a difference between a concentration of the p-type dopants in the semiconductor body and a concentration of n-type dopants in the semiconductor body.

* * * * *